(12) United States Patent
Machida

(10) Patent No.: US 7,936,061 B2
(45) Date of Patent: May 3, 2011

(54) SEMICONDUCTOR DEVICE AND METHOD OF MANUFACTURING THE SAME

(75) Inventor: Yoshihiro Machida, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 67 days.

(21) Appl. No.: 12/485,601

(22) Filed: Jun. 16, 2009

(65) Prior Publication Data
US 2009/0309231 A1    Dec. 17, 2009

(30) Foreign Application Priority Data

Jun. 17, 2008    (JP) ................................. 2008-158241

(51) Int. Cl.
*H01L 21/00*    (2006.01)
(52) U.S. Cl. ........................................ 257/698; 438/127
(58) Field of Classification Search .......... 257/698–700; 438/106–127
See application file for complete search history.

(56) References Cited

U.S. PATENT DOCUMENTS
7,239,021 B2 * 7/2007 Arai et al. ..................... 257/777

FOREIGN PATENT DOCUMENTS
JP    9-097860    4/1997
JP    2003-152001    5/2003

* cited by examiner

*Primary Examiner* — Richard A. Booth
(74) *Attorney, Agent, or Firm* — Rankin, Hill & Clark LLP

(57) ABSTRACT

A semiconductor device includes: a first insulating layer having an opening therethrough; a first wiring pattern disposed on the first insulating layer; an external connection terminal provided on a portion of the first wiring pattern exposed from the opening; a second insulating layer which covers the first wiring pattern and having via holes therethrough; a second wiring pattern disposed within the second insulating layer and electrically connected to the first wiring pattern via a conductive material filled in at least one of the via holes; a semiconductor element having an electrode thereon and mounted on the second insulating layer to be electrically connected to the first wiring pattern through the electrode disposed in at least one of the via holes; an underfill resin filled between the semiconductor element and the second insulating layer; and a sealing resin portion which seals the semiconductor element.

4 Claims, 15 Drawing Sheets

SEMICONDUCTOR DEVICE AND METHOD OF MANUFACTURING THE SAME

This application claims priority from Japanese Patent Application No. 2008-158241, filed on Jun. 17, 2008, the entire contents of which are incorporated by reference herein.

BACKGROUND OF THE INVENTION

1. Technical Field

The present disclosure relates to a semiconductor device and a manufacturing method of the semiconductor device.

2. Related Art

In a related-art semiconductor device, a semiconductor element is mounted on a wiring board made of a glass epoxy resin or the like, on which a wiring pattern is formed, and then the semiconductor device is electrically connected to the wiring pattern.

FIGS. 15 and 16 illustrate the related-art semiconductor device. FIG. 15 is a cross-sectional view illustrating a semiconductor device 200 formed by a wire bonding method. In FIG. 15, a semiconductor element 120 is mounted on a surface of a wiring board having a wiring pattern 116 that electrically connects a connection pad 112 formed on one side of a substrate K via a through hole 110 to an external connection terminal 114 formed on the other side thereof. An electrode pad 122 formed on the semiconductor element 120 is electrically connected to a connection pad 112 of the wiring board by a bonding wire 130. Subsequently, the semiconductor element 120 and the bonding wire 130 are sealed with a sealing resin. Further, FIG. 16 is a cross-sectional view illustrating a semiconductor device 200 formed by a flip-chip connection method. In FIG. 16, an electrode 126 (i.e., an electrode pad 122 and a bump 124) of a semiconductor element 120 is bonded to a connection pad 112 formed one surface of a wiring board. Then, an underfill resin 150 is injected between the connection pad 112 and the electrode 126.

The above semiconductor devices 200 are disclosed in, e.g., JP-A-9-97860 (the wire bonding connection method) and JP-A-2003-152001 (the flip-chip connection method).

The thickness dimension of a semiconductor device can be considerably reduced by employing the flip-chip connection method, which is illustrated in FIG. 16, instead of employing the wire bonding connection method, which is illustrated in FIG. 15.

In recent years, a further reduction in the thickness of semiconductor devices has been desired. The semiconductor device formed by the flip-chip connection method is reaching the limit on the reduction in the thickness thereof.

SUMMARY OF THE INVENTION

Exemplary embodiments of the present invention address the above disadvantages and other disadvantages not described above. However, the present invention is not required to overcome the disadvantages described above, and thus, an exemplary embodiment of the present invention may not overcome any of the problems described above.

An inventor of the invention has focused attention on the fact that the thickness dimension of a semiconductor can be reduced by not using a substrate which supports a wiring pattern. Accordingly, it is an aspect of the present invention to provide a semiconductor device which can easily be handled in a manufacturing process thereof even in the case of omitting a substrate, and to provide a manufacturing method thereof.

According to one or more aspects of the present invention, there is provided a semiconductor device. The semiconductor device comprises: a first insulating layer having an opening therethrough; a first wiring pattern disposed on the first insulating layer; an external connection terminal provided on a portion of the first wiring pattern which is exposed from the opening; a second insulating layer which covers the first wiring pattern and which comprises a plurality of via holes therethrough; a second wiring pattern disposed within the second insulating layer and electrically connected to the first wiring pattern via a conductive material filled in at least one of the via holes; a semiconductor element having an electrode thereon and being mounted on the second insulating layer so as to be electrically connected to the first wiring pattern through the electrode, wherein the electrode is disposed in at least one of the via holes; an underfill resin which is filled between the semiconductor element and the second insulating layer; and a sealing resin portion which seals the semiconductor element.

According to one or more aspects of the present invention, there is provided a semiconductor device. The semiconductor device comprises: a first insulating layer having an opening therethrough; a first wiring pattern disposed on the first insulating layer; an external connection terminal provided on a portion of the first wiring pattern which is exposed from the opening; a second insulating layer which covers the first wiring pattern and which comprises a via hole and a through hole, wherein the through hole is configured to penetrate the second insulting layer and the first insulating layer; a second wiring pattern disposed within the second insulating layer and electrically connected to the first wiring pattern via a conductive material filled in the via hole; a semiconductor element having an electrode thereon and being mounted on the second insulating layer, wherein the electrode is disposed in the through hole; an underfill resin which is filled between the semiconductor element and the second insulating layer; and a sealing resin portion which seals the semiconductor element.

According to one or more aspects of the present invention, there is provided a method of manufacturing a semiconductor device. The method comprises: (a) providing a metal foil; (b) laminating a first carrier tape to the metal foil; (c) forming a first insulating layer on the metal foil; (d) forming an opening through the first insulating layer; (e) laminating a second carrier tape on the first insulating layer; (f) removing the first carrier tape; (g) etching the metal foil to form a first wiring pattern; (h) forming a second insulating layer to cover the first wiring pattern; (i) preparing a third carrier tape on which a second wiring pattern is formed; (j) pressing the third carrier tape against the second insulating layer such that the second wiring pattern faces to the second insulating layer, thereby embedding the second wiring pattern in the second insulating layer; (k) removing the third carrier tape; (l) forming a plurality of via-holes in the second insulating layer; (m) filling an conductive material in at least one of the via-holes; (n) providing an underfill resin on an exposed surface of the second wiring pattern; (o) mounting a semiconductor element having an electrode thereon on the second insulating layer such that the electrode is disposed in another one of the via-holes, thereby electrically connecting the semiconductor element to the first wiring pattern through the electrode disposed in another one of the via-holes; (p) sealing the semiconductor element with a sealing resin to form a sealing resin portion; (q) removing the second carrier tape; and (r) providing an external connection terminal on a portion of the first wiring pattern which is exposed from the opening.

According to one or more aspects of the present invention, there is provided a method of manufacturing a semiconductor device. The method comprises: (a) providing a metal foil; (b) laminating a first carrier tape on the metal foil; (c) forming a first insulating layer on the metal foil; (d) forming an opening through the first insulating layer; (e) laminating a second carrier tape on the first insulating layer; (f) removing the first carrier tape; (g) etching the metal foil to form a first wiring pattern; (h) forming a second insulating layer to cover the first wiring pattern; (i) preparing a third carrier tape on which a second wiring pattern is formed; (j) pressing the third carrier tape against the second insulating layer such that the second wiring pattern faces to the second insulating layer, thereby embedding the second wiring pattern in the second insulating layer; (k) removing the third carrier tape; (l) forming a via-hole and a through hole in the second insulating layer; (m) filling an conductive material in the via-hole; (n) providing an underfill resin on an exposed surface of the second wiring pattern; (o) mounting a semiconductor element having an electrode thereon on the second insulating layer such that the electrode provided on the semiconductor element is disposed in the through hole; (p) sealing the semiconductor element with a sealing resin to form a sealing resin portion; (q) removing the second carrier tape; and (r) providing an external connection terminal on a portion of the first wiring pattern which is exposed from the opening.

According to the present invention, an extremely thin semiconductor device can be provided. Also, the respective manufacturing steps can be smoothly handled. Accordingly, manufacturing efficiency can be enhanced, and also semiconductor devices can be provided at low cost.

Other aspects and advantages of the invention will be apparent from the following description, the drawings and the claims.

DETAILED DESCRIPTION OF EXEMPLARY EMBODIMENT OF THE INVENTION

First Embodiment

Hereinafter, an exemplary embodiment of the present invention will be now described with reference to the drawings. FIGS. 1A to 5C are cross-sectional views illustrating manufacturing steps of a semiconductor device according to the first embodiment. Although FIGS. 1A to 5C each illustrate a single semiconductor device, it is apparent that plural semiconductor devices can simultaneously be manufactured by mounting a plurality of semiconductor elements on a wiring pattern.

Figure 1A:
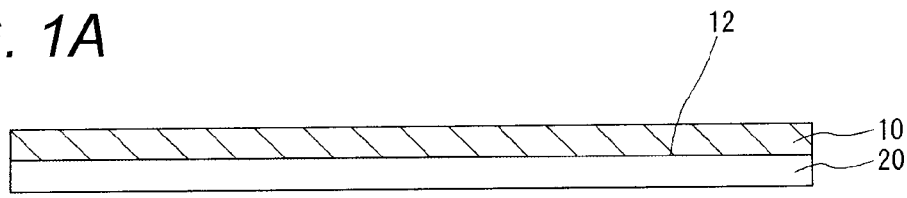
FIGS. 1A to 1D are cross-sectional views illustrating manufacturing steps of a semiconductor device according to a first embodiment of the invention.

First, as illustrated in FIG. 1A, a first carrier tape 20 is bonded to a copper foil 10 which is a metal foil, so that the copper foil 10 and the carrier tape 20 are stacked. The present embodiment employs a copper foil 10 having a thickness of about 12 μm to about 15 μm. A first carrier tape 20 is formed on a shiny surface 12 (i.e., a high-smoothness side surface) of the copper foil 10.

A carrier tape having a base material constituted by a polyethylene terephthalate (PET) film, on one side surface of which an acrylic adhesive agent is applied, is used as the first carrier tape 20 according to the present embodiment. In addition to the acrylic adhesive agent, the shiny surface 12 of the copper foil 10 is employed as a bonding surface. This is advantageous in that the first carrier tape 20 can easily be peeled off when the first carrier tape 20 is removed in a subsequent step, and the adhesive does not remain on the copper foil 10 when the first carrier tape 20 is removed later.

Figure 1B:
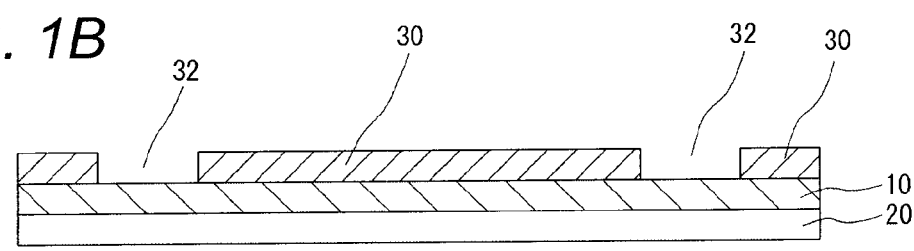

Next, as illustrated in FIG. 1B, a solder resist 30 serving as a first insulating layer is formed on the copper foil 10. According to the present embodiment, an opening 32 is formed by irradiating laser light onto a certain portion of the solder resist 30 after the solder resist 30 of the film type is formed thereon.

Figure 1C:
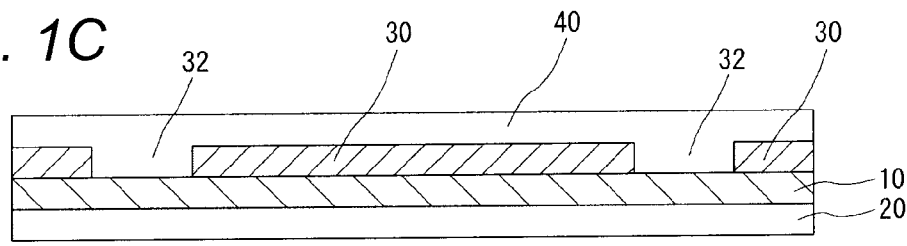
Figure 1D:
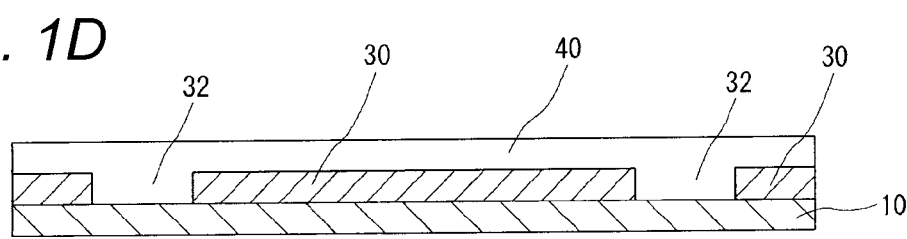

Next, as illustrated in FIG. 1C, a second carrier tape 40 is formed on one surface of the solder resist 30. The second carrier tape 40 can be laminated using, e.g., a roll laminator. The second carrier tape 40 can be laminated by being pushed with a roller so as to follow the shape of the surface of the solder resist 30. Thus, as illustrated in FIG. 1C, the second carrier tape 40 is embedded into (or filled in) the opening 32. The present embodiment employs the second carrier tape 40 having a configuration similar to that of the first carrier tape 20. After the second carrier tape 40 is laminated onto the surface of the solder resist 30, the first carrier tape 20 is removed, as illustrated in FIG. 1D. The first carrier tape 20 can manually be removed.

Figure 2A:
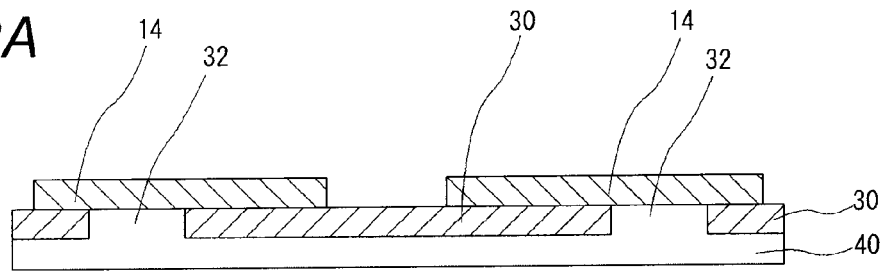
FIGS. 2A to 2C are cross-sectional views illustrating manufacturing steps of the semiconductor device according to the first embodiment.

Next, a laminated body of the copper foil 10, the solder resist 30, and the second carrier tape 40 is flipped such that the copper foil 10 is placed at the upper side of the laminated body. Subsequently, the patterning of the copper foil 10 is performed by a subtractive method. Thus, a first wiring pattern layer 14 is formed. FIG. 2A illustrates a state in which the first wiring pattern layer 14 is formed.

Figure 2B:
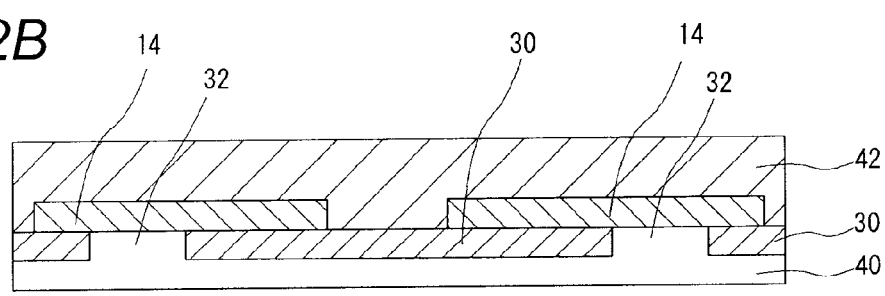

Next, as illustrated in FIG. 2B, an insulating resin 42 is formed thereon as the second insulating layer. Thus, the first wiring pattern layer 14 is coated with the insulating layer 42. A material, which can be easily processed by laser beam machining and is small in curing shrinkage, may be used as the insulating resin 42. According to the present embodiment, an epoxy resin may be used as the insulating resin 42. At that time, the insulating resin 42 is maintained in an uncured state. The insulating resin 42 remains in a final product. The insulating resin 42 fixes a wiring layer, which includes a plurality of wiring pattern layers, in an insulating state.

Figure 2C:
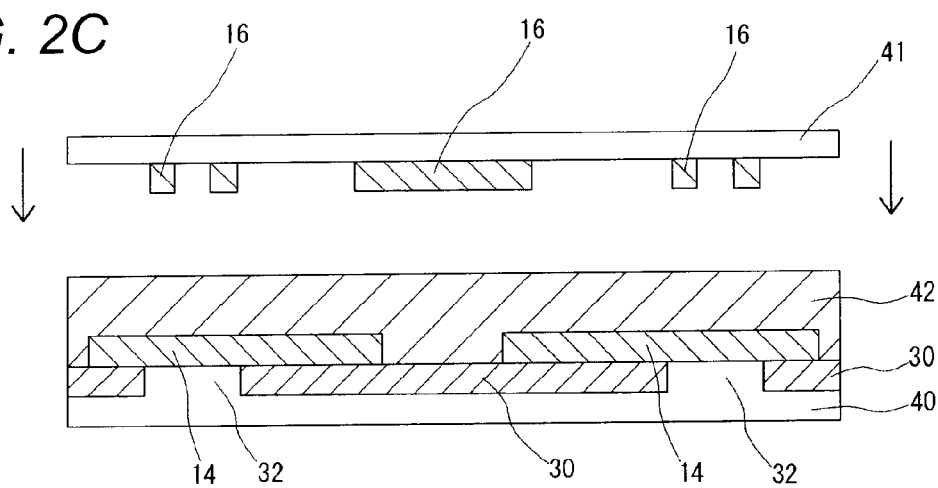

Next, a third carrier tape 41 having a second wiring pattern layer 16 thereon is prepared. The second wiring pattern layer 16 can be formed using a subtractive method as a method for forming the second wiring pattern layer 16 on the third carrier tape 41 after a metal foil such as a copper foil is laminated on the third carrier tape 41. The third carrier tape 41, on which the second wiring pattern layer 16 is formed in this manner, is pushed against the uncured insulating resin 42 such that the second wiring pattern layer 16 faces to the insulating resin 42 as illustrated in FIG. 2C.

Figure 3A:
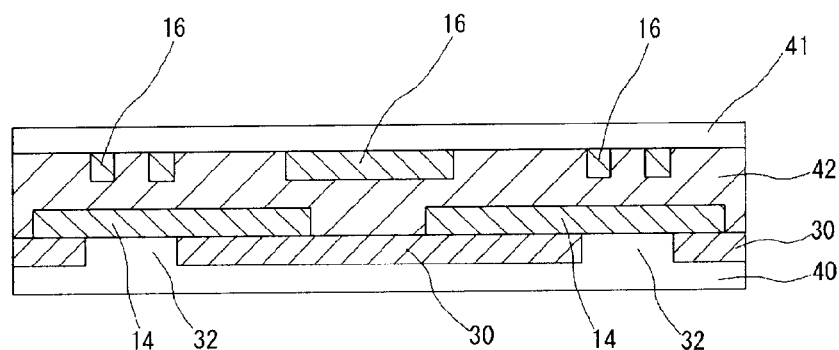
FIGS. 3A to 3C are cross-sectional views illustrating manufacturing steps of the semiconductor device according to the first embodiment.
Figure 3B:
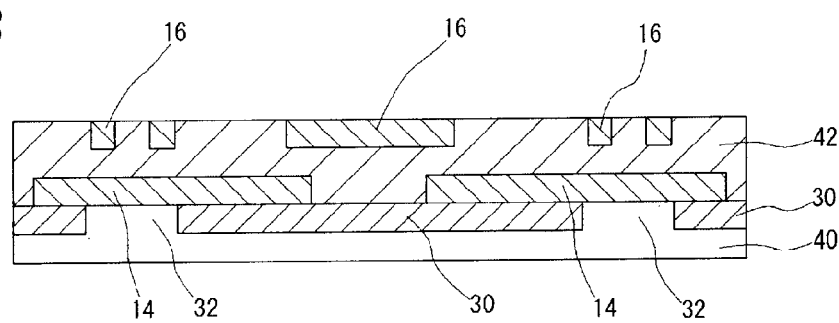
Figure 3C:
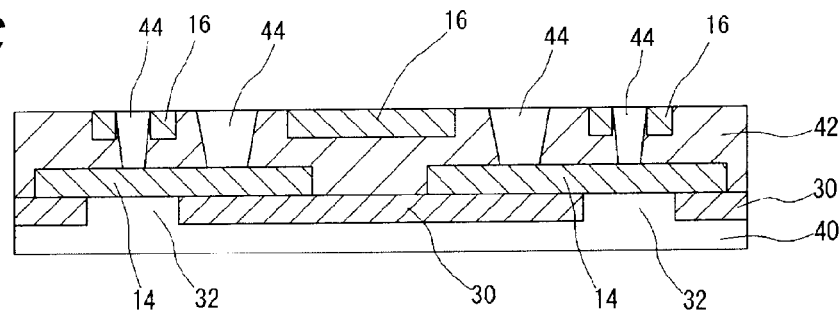

FIG. 3A illustrates a state in which the second wiring pattern layer 16 is embedded in the insulating resin 42. A layer made of the insulating resin 42 is formed such that the thickness of this layer is sufficiently larger than a sum of the height of the first wiring pattern layer 14 and the height of the second wiring pattern layer 16. In this state, the first wiring pattern layer 14 and the second wiring pattern layer 16 are not electrically connected to each other in the insulating resin 42. As can be seen from FIG. 3B, the top surface of the second wiring pattern layer 16 and the top surface of the layer made of the insulating resin 42 are formed to be flush with each other. Next, as illustrated in FIG. 3B, the third carrier tape 41 is removed. Then, the insulating resin 42 is cured. After the insulating resin 42 is cured, the insulating resin 42 is irradiated with a laser light by a laser light irradiating apparatus. Thus, via-holes 44 are formed on a certain portion of the layer made of the insulating resin 42, respectively. As illustrated in FIG. 3C, the via-holes 44 are formed to reach the top surface of the first wiring pattern layer 14.

Figure 4A:
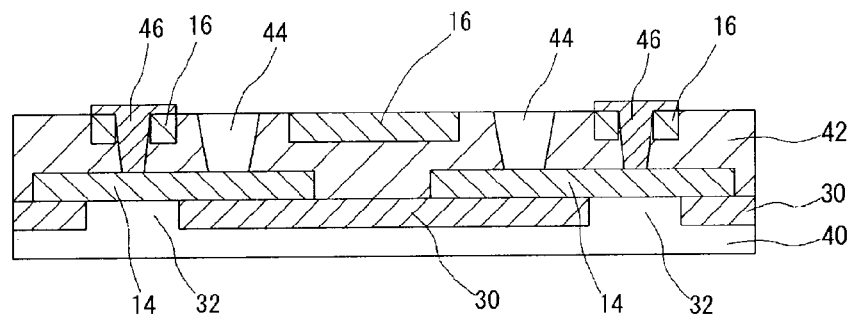
FIGS. 4A to 4C are cross-sectional views illustrating manufacturing steps of the semiconductor device according to the first embodiment.

Next, as illustrated in FIG. 4A, an conductive material 46 is filled in the via-hole 44 where the first wiring pattern layer 14 and the second wiring pattern layer 16 are electrically connected to each other. The present embodiment uses a silver paste as the conductive material 46. A pattern mask (not shown) having an opening corresponding to the via-hole 44 in which the conductive material 46 is to be filled is provided on the top surface of the layer made of the insulating resin 42. The conductive material 46 is filled in the via-hole 44 by a print method using a squeegee or the like. The conductive material 46 can be a conductive paste into which conductive powder or filler particles are mixed. Particularly, it is advantageous to use a copper paste. It is apparent that a method other than the print method can be employed as the method for filling the conductive material 46 in the via-hole 44. Thus, the first wiring pattern layer 14 and the second wiring pattern layer 16 can be electrically connected to each other by filling the conductive material 46 in the via-hole 44.

Figure 4B:
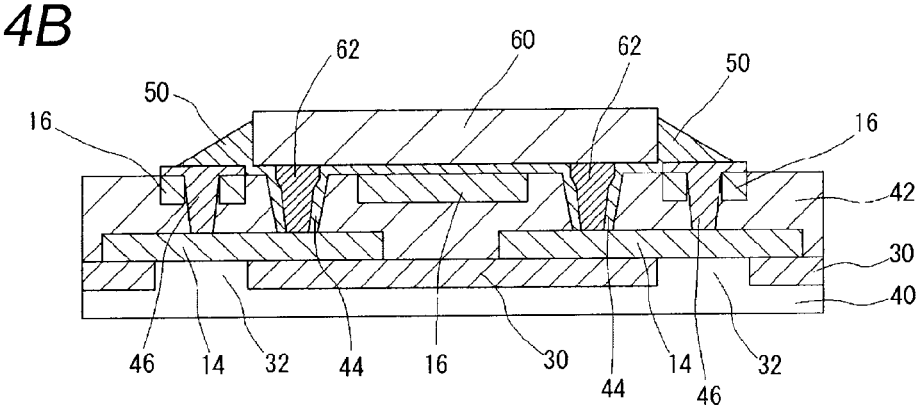

Next, an underfill resin 50 is provided on a surface of each via-hole 44, in which no conductive material 46 is filled, and on a surface of the insulating resin 42, which includes the surface of conductive material 46. Then, a semiconductor element 60 having electrodes 62 (e.g., Au bump) thereon is mounted on the insulating resin 42 via the underfill resin 50 by a flip-chip connection method. The respective electrodes 62 are disposed in the via-holes 44 in which the underfill resin 50 is provided. Then, each of the electrodes 62 is electrically connected to a surface of the first wiring pattern layer 14, which constitutes the bottom surface of the via-hole 44, by pushing away the underfill resin 50. According to the present embodiment, each of the electrodes 62 is electrically connected to the first wiring pattern layer 14 while applying ultrasonic vibrations to the semiconductor element 60. FIG. 4B illustrates a state in which the semiconductor element 60 is electrically connected to the first wiring pattern layer 14.

Figure 4C:
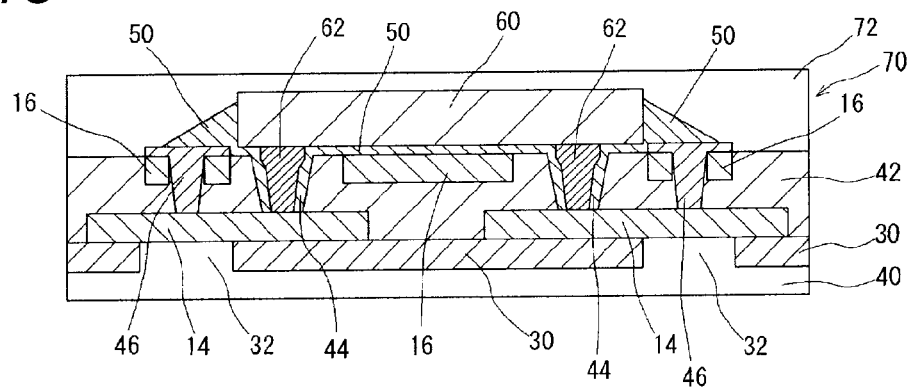

After the underfill resin 50 is cured, the semiconductor element 60 is resin-formed with a sealing resin 72 to cover a surface of the semiconductor device, on which the semiconductor element 60 is mounted, as illustrated in FIG. 4C. Thus, a sealing resin portion 70 is formed. It is advantageous to use a transfer molding apparatus when the sealing resin portion 70 is formed.

Figure 5A:
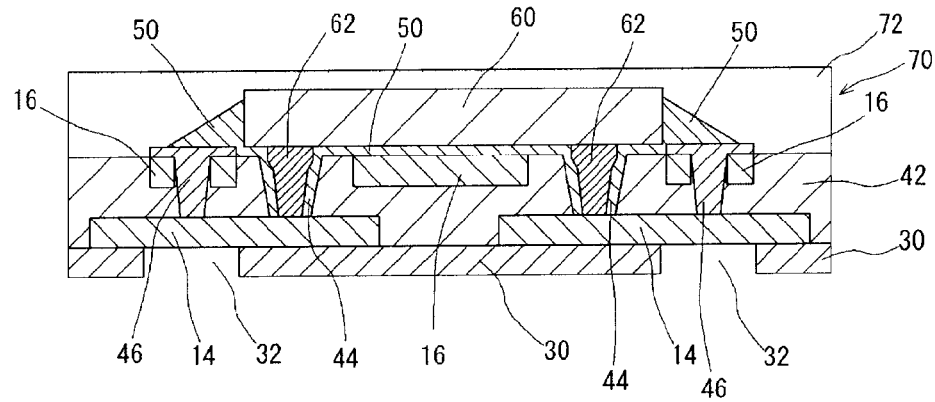
FIGS. 5A to 5C are cross-sectional views illustrating manufacturing steps of the semiconductor device according to the first embodiment.
Figure 5B:
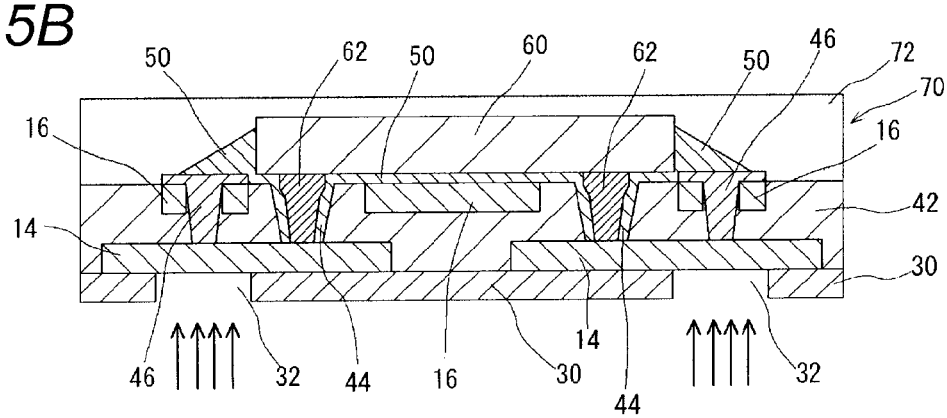
Figure 5C:
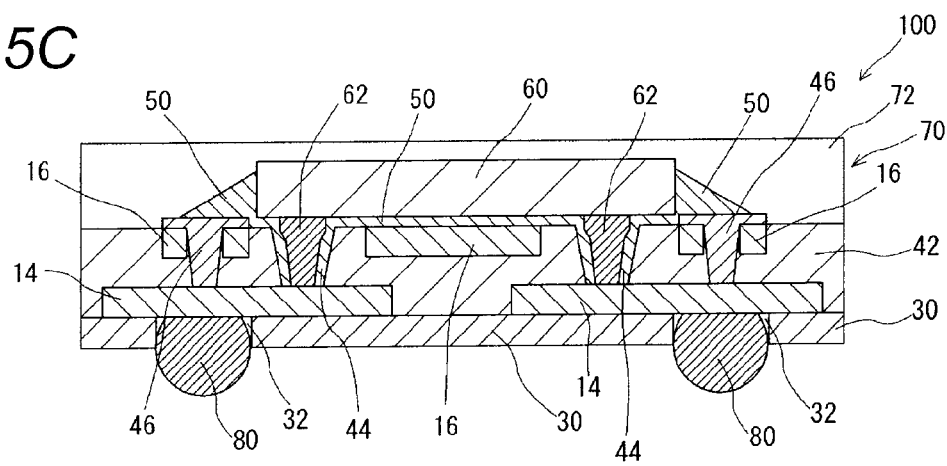

Next, as illustrated in FIG. 5A, the second carrier tape 40 is removed. The second carrier tape 40 also can be peeled off manually and easily. As described above, an acrylic adhesive agent is used as the adhesive agent for the second carrier tape 40. Thus, the second carrier tape 40 can easily be peeled off. However, sometimes, the adhesive agent is changed in nature by being heated when the laminated body 90 is resin-sealed. Thus, the adhesive or the changed adhesive may remain on portions of the first wiring pattern layer 14, which are exposed from the openings 32 in the solder resist 30. In such a case, each exposed surface (i.e., each connection pad surface) of the first wiring pattern layer 14 (i.e., connection pads) exposed from the openings 32 can be cleaned by plasma processing, as illustrated in FIG. 5B. Argon plasma etching or oxygen plasma etching can be used as the plasma processing.

After cleaning the portions of the first wiring pattern layer 14, which are exposed from the opening 32, external connection terminals 80 such as solder bumps are provided on the exposed portions of the first wiring pattern layer 14. Thus, a semiconductor device 100 illustrated in FIG. 5C can be obtained. The semiconductor device 100 is divided by, e.g., a dicer into individual pieces, as occasion demands.

In the semiconductor device 100 according to the present embodiment, the first wiring pattern layer 14 is formed directly on the solder resist 30, and the first wiring pattern layer 14 and the second wiring pattern layer 16 are electrically connected to each other by the conductive material 46 filled in the insulating resin 42. The insulating resin 42 supports the first wiring pattern layer 14 and the second wiring pattern layer 16 (these two wiring pattern layers are collectively referred to as the wiring layer in the present embodiment) at different height positions, and the semiconductor element 60 which is directly and electrically connected to the first wiring pattern layer 14 is mounted on the insulating resin 42 via the underfill resin 50. The sealing resin portion 70 is formed by covering a portion of the semiconductor element 60, the underfill resin 50 and the wiring pattern 14, using the sealing resin 72, and the external connection terminals 80 are provided on the lower-side surface of the first wiring pattern layer 14 exposed from the opening 32 which is formed in the solder resist 30. Accordingly, the semiconductor device 10 having extremely thin thickness can be obtained, as compared with the related-art semiconductor device which has the substrate and is manufactured by the flip-chip connection method.

Second Embodiment

Figure 6:
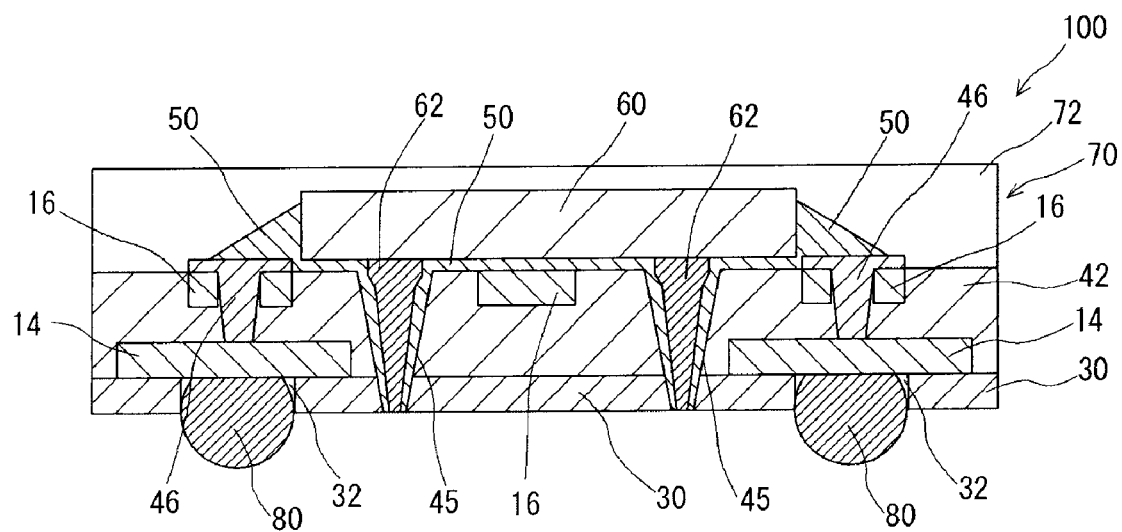
FIG. 6 is a cross-sectional view illustrating a semiconductor device according to a second embodiment of the invention.

In the first embodiment, the electrodes 62 of the semiconductor element 60 are electrically connected to the upper side surface of the first wiring pattern layer 14. However, exemplary embodiments of the present invention are not limited thereto. For example, the semiconductor device 100, in which the electrodes 62 are exposed from the openings 32 formed in the solder resist 30, as illustrated in FIG. 6, can be also employed.

In the case of employing this configuration, when the via-holes 44 are formed, through holes 45 are formed which penetrate through layers from a surface of the insulating resin 42 to the lower-side surface of the solder resist 30. When the conductive material 46 is filled therein, a print method using a squeegee or the like is applied using a mask plate formed into an opening pattern which covers the through holes 45. After filling the conductive material 46 therein, the mask plate is removed. After the underfill resin 50 is supplied thereto, the electrodes 62 formed on the semiconductor element 60 are inserted into the through holes 45. Thus, the semiconductor device 100 illustrated in FIG. 6 can be obtained. The underfill resin 50 enters each of the through holes 45 together with an associated one of electrodes 62. The electrodes 62 and the underfill resin 50 are exposed from the openings 32 formed at the side of the solder resist 30. It is advantageous to appropriately remove superfluous underfill resin 50 which bulges out of the openings 32.

Third Embodiment

In the first embodiment and the second embodiment, there has been described the case that the first wiring pattern layer 14 and the second patterning layer 16 are formed using the subtractive method. However, depending on the thickness of the copper foil 10, the first wiring pattern layer 14 and the second wiring pattern layer 16 can be formed by a semi-additive method. In a third embodiment of the invention, the semi-additive method is applied to the first wiring pattern layer 14 and the second wiring pattern layer 16, instead of the subtractive method. FIGS. 7A to 11B are cross sectional views illustrating manufacturing steps of a semiconductor device according to a third embodiment of the invention.

Figure 7A:
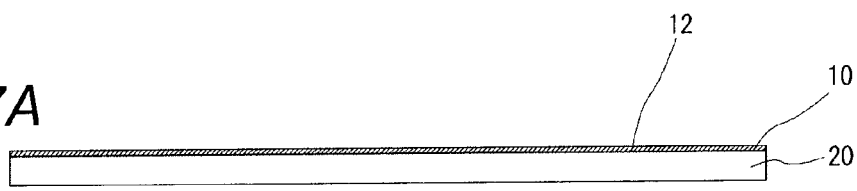
FIGS. 7A to 7E are cross-sectional views illustrating manufacturing steps of a semiconductor device according to a third embodiment of the invention.
Figure 7B:
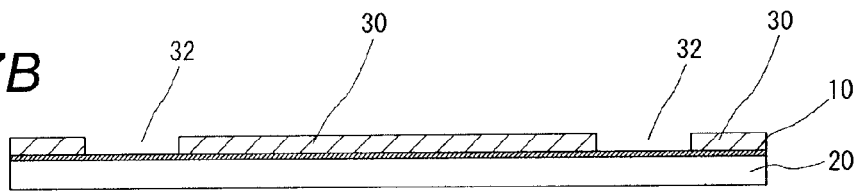
Figure 7C:
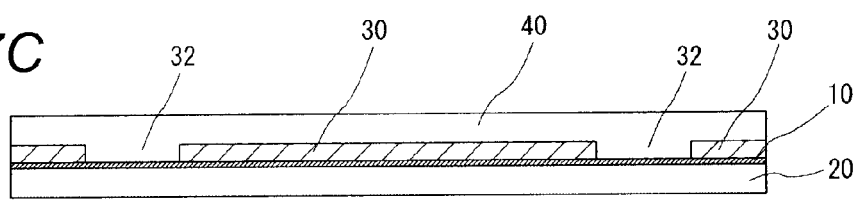
Figure 7D:
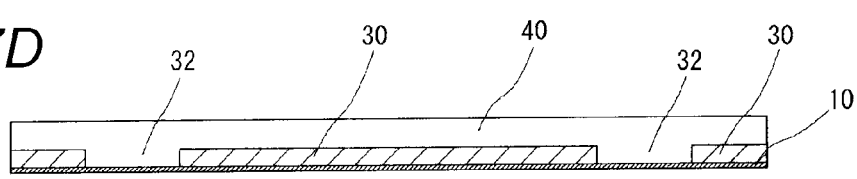
Figure 7E:
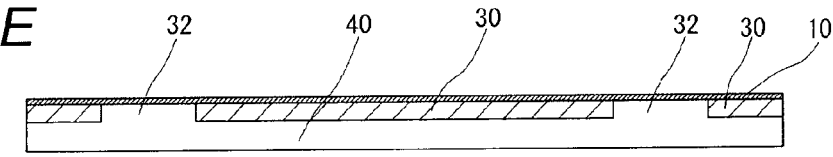

First, as illustrated in FIG. 7A, a first carrier tape 20 is laminated on a shiny surface 12 of a copper foil 10. According to the present embodiment, the copper foil 10 having the thickness of about 2 µm to about 3 µm is used. Subsequently, a solder resist 30 of the film type is laminated on the copper foil 10 as a first insulating layer. Openings 32 are formed in the solder resist 30 by irradiating laser light to forming positions in which external connection terminals are to be formed (see FIG. 7B). Subsequently, as illustrated in FIG. 7C, a second carrier tape 40 is formed on the surface of the solder resist 30. Then, the first carrier tape 20 is peeled off and removed (see FIG. 7D). After the first carrier tape 20 is removed, the top surface and the bottom surface of a laminated body including the copper foil 10, the solder resist 30, and the second carrier tape 40 are turned over such that the copper foil 10 is placed as an upper side surface (see FIG. 7E).

Figure 8A:
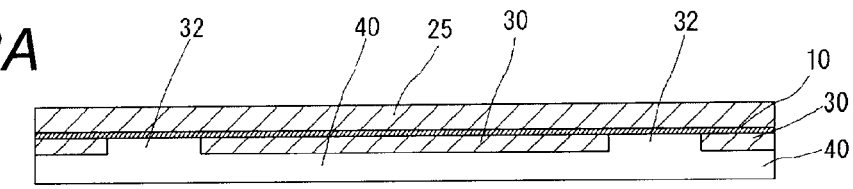
FIGS. 8A to 8D are cross-sectional views illustrating manufacturing steps of the semiconductor device according to the third embodiment.
Figure 8B:
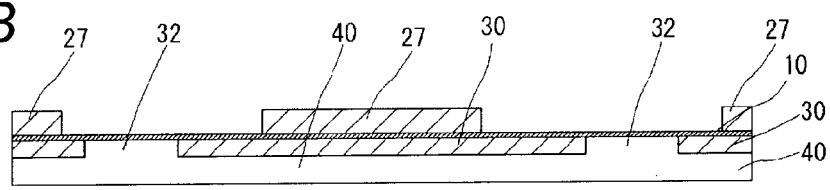
Figure 8C:
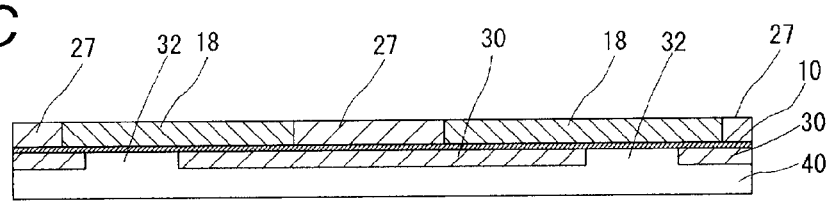

Next, as illustrated in FIG. 8A, a plating resist 25 is laminated onto the surface of the copper foil 10. A photosensitive resin formed like a film may be used as the plating resist 25 according to the present embodiment. The plating resist 25 formed on the copper foil 10 is exposed and developed through a photolithography process. Thus, as illustrated in FIG. 8B, a plating mask 27 is formed. After the plating mask 27 is formed, electrolyte copper plating is performed using the copper foil 10 as a seed metal. Thus, as illustrated in FIG. 8C, copper plating layers 18 are respectively formed in openings of the plating mask 27. After the copper layers 18 are formed, the plating mask 27 is removed by, e.g., wet etching.

Figure 8D:
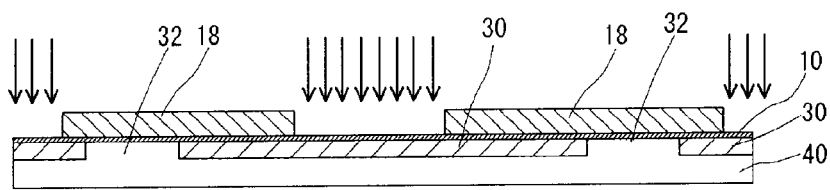
Figure 9A:
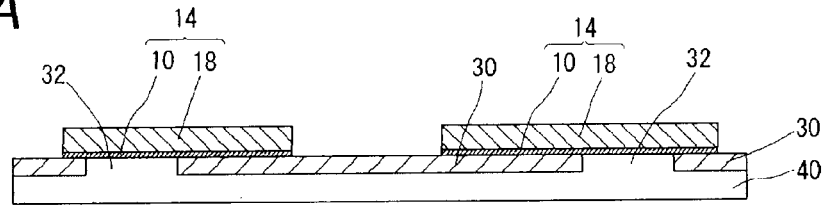
FIGS. 9A to 9D are cross-sectional views illustrating manufacturing steps of the semiconductor device according to the third embodiment.
Figure 9B:
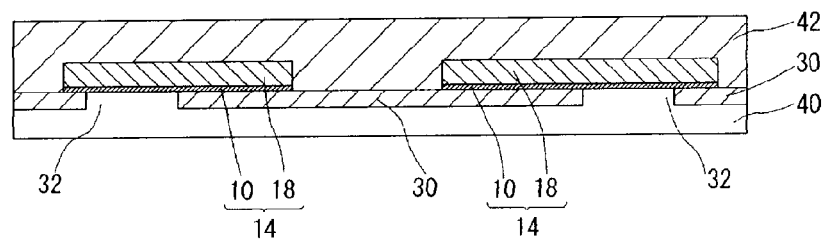

Next, as illustrated in FIG. 8D, the copper plating layers 18 are separated from one another by etching portions of the copper foil 10, which are covered by the plating mask 27 (i.e., portions of the copper foil 10, which are exposed by removing the plating mask 27). Thus, as illustrated in FIG. 9A, a first wiring pattern layer 14 including the copper foil 10 and the copper plating layers 18 is formed. After the first wiring pattern layer 14 is formed, an insulating resin 42 is formed as a second insulating layer to cover the first wiring pattern layer 14, as illustrated in FIG. 9B. A material, which can be easily processed by laser machining and is small in curing shrinkage, is advantageously used as the insulating resin 42. According to the present embodiment, an epoxy resin may be used as the insulating resin 42. At that time, the insulating resin 42 is maintained in an uncured state. The insulating resin 42 remains in a final product. The insulating resin 42 fixes a wiring layer, which includes a plurality of wiring pattern layers, in an insulating state.

Figure 9C:
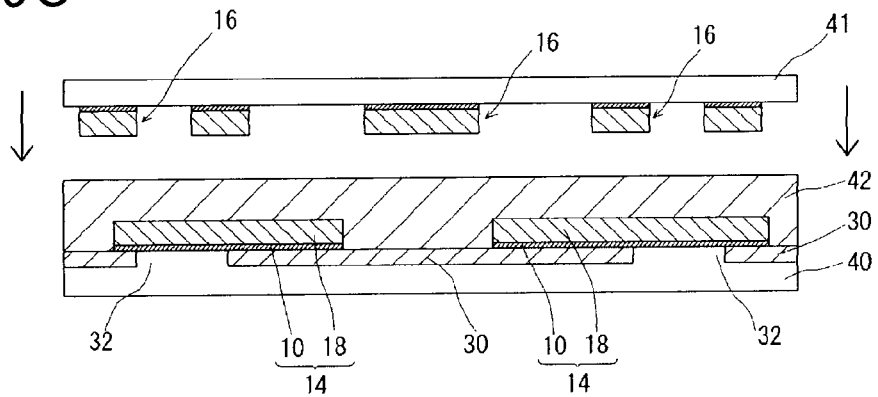

Next, a third carrier tape 41, having a second wiring pattern layer 16 thereon is prepared. The second wiring pattern layer 16 can be formed using a semi-additive method as a method for forming the second wiring pattern layer 16 on the third carrier tape 41 after a thin metal foil such as a copper foil is laminated on the third carrier tape 41. A process of patterning the copper foil according to the semi-additive method can be performed similarly to the process of forming the first wiring pattern layer 14. Thus, the detail description of the process of patterning the copper foil is omitted herein. Consequently, the third carrier tape 41, on which the second wiring pattern layer 16 is formed in this manner, is pushed against the uncured insulating resin 42 such that the second wiring pattern layer 16 faces to the insulating resin 42, as illustrated in FIG. 9C.

Figure 9D:
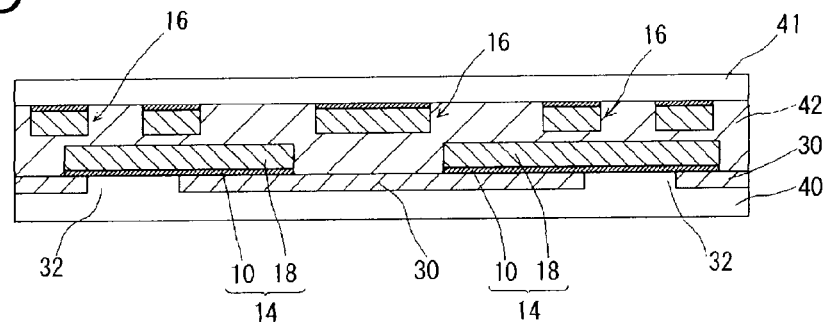

FIG. 9D illustrates a state in which the second wiring pattern layer 16 is embedded in the insulating resin 42. The second wiring pattern layer 16 can be embedded in the insulating resin 42 only by simply stacking the third carrier tape 41 on the layer made of the insulating resin 42 such that the bottom surface of the third carrier tape 41 contacts the surface of the layer made of the insulating resin 42. Thus, the top surface position of the second wiring pattern layer 16 is flush with the top surface position of the layer made of the insulating resin 42. The thickness of the layer made of the insulating resin 42 is sufficiently larger than a sum of the height of the first wiring pattern layer 14 and the height of the second wiring pattern layer 16. Thus, in this state, the first wiring pattern layer 14 and the second wiring pattern layer 16 are not electrically connected to each other.

Next, the third carrier tape 41 is removed. Then, the insulating resin 42 is cured. After the insulating resin 42 is cured, the insulating layer 42 is irradiated with a laser light by a laser light irradiating apparatus. Thus, via-holes 44 are formed on a certain portion of the layer made of the insulating resin 42, respectively. The via-holes 44 are formed to reach the top surface of the first wiring pattern layer 14.

Figure 10A:
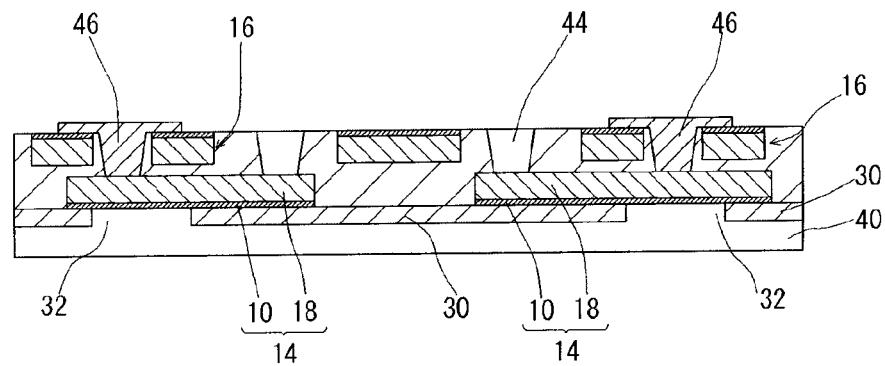
FIGS. 10A to 10C are cross-sectional views illustrating manufacturing steps of the semiconductor device according to the third embodiment.

Next, as illustrated in FIG. 10A, an conductive material 46 is filled in the via-hole 44 where the first wiring pattern layer 14 and the second wiring pattern layer 16 are electrically connected to each other. The present embodiment uses a silver paste as the conductive material 46. A pattern mask (not shown) having an opening corresponding to the via-hole 44 in which the conductive material 46 is to be filled is provided on the top surface of the layer made of the insulating resin 42. The conductive material 46 is filled in the via-hole 44 by a print method using a squeegee or the like. In this case, it is possible to prevent the conductive material 46 from being filled in the via-hole 44 which permits entering of the electrode 62 in the semiconductor element 60 later. The conductive material 46 can be a conductive paste into which conductive powder or filler particles are mixed. Particularly, it is advantageous to use a copper paste. It is apparent that a method other than the print method can be employed as the method for filling the conductive material 46 in the via-hole 44. Thus, the first wiring pattern layer 14 and the second wiring pattern layer 16 can be electrically connected to each other by filling the conductive material 46 in the via-hole 44.

Figure 10B:
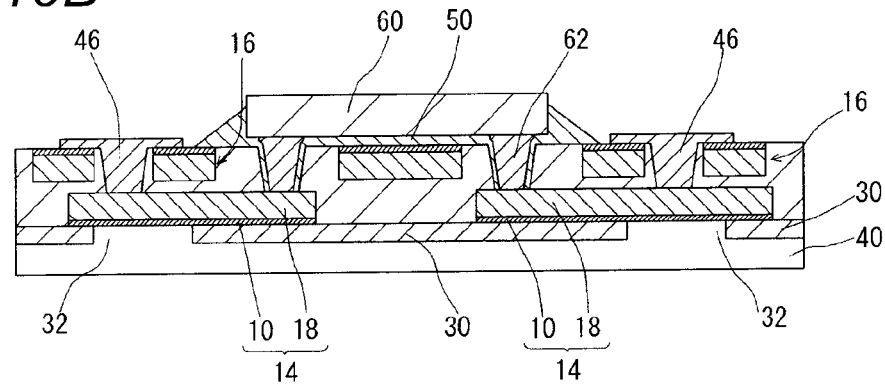

Next, an underfill resin 50 is provided on a surface of each via-hole 44, in which no conductive material 46 is filled, and on a surface of the insulating resin 42, which includes the surface of conductive material 46. Then, a semiconductor element 60 having electrodes 62 (e.g., Au bump) thereon is mounted on the insulating resin 42 via the underfill resin 50 by a flip-chip connection method. The respective electrodes 62 are disposed in the via-holes 44 in which the underfill resin 50 is provided. Then, each of the electrodes 62 is electrically connected to a surface of the first wiring pattern layer 14, which constitutes the bottom surface of the via-hole 44, by pushing away the underfill resin 50. According to the present embodiment, each of the electrodes 62 is electrically connected to the first wiring pattern layer 14 while applying ultrasonic vibrations to the semiconductor element 60. FIG. 10B illustrates a state in which the semiconductor element 60 is electrically connected to the first wiring pattern layer 14.

Figure 10C:
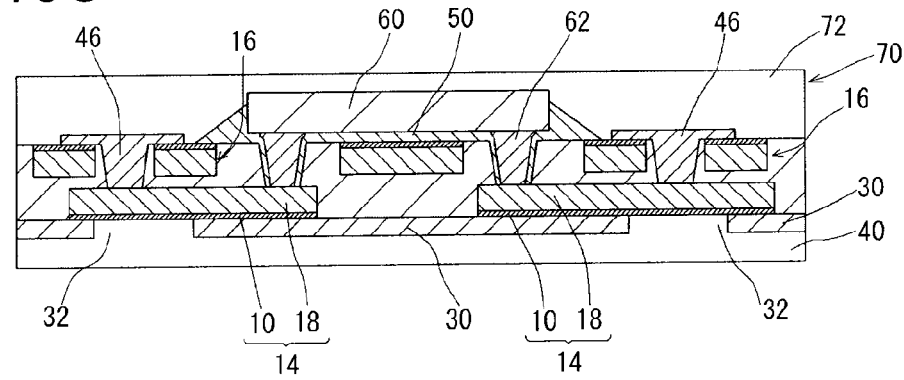

After the underfill resin 50 is cured, the semiconductor element 60 is resin-formed with a sealing resin 72 to cover a surface of the semiconductor device, on which the semiconductor element 60 is mounted, as illustrated in FIG. 10C. Thus, a sealing resin portion 70 is formed. It is advantageous to use a transfer molding apparatus when the sealing resin portion 70 is formed.

Figure 11A:
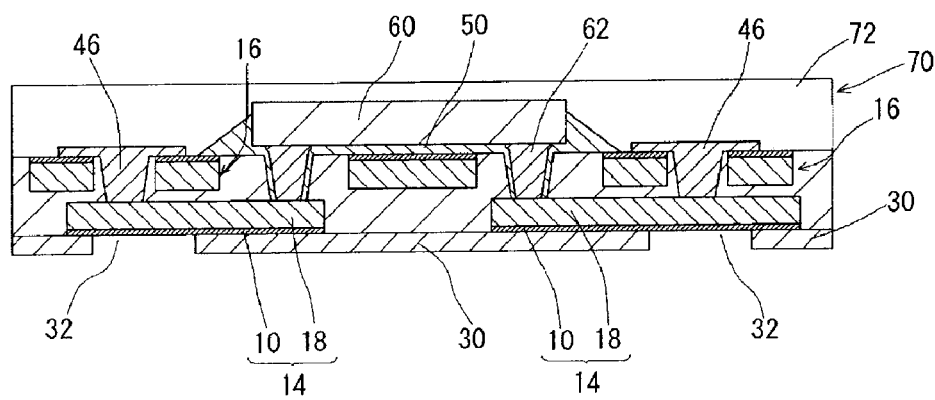
FIGS. 11A and 11B are cross-sectional views illustrating manufacturing steps of the semiconductor device according to the third embodiment.
Figure 11B:
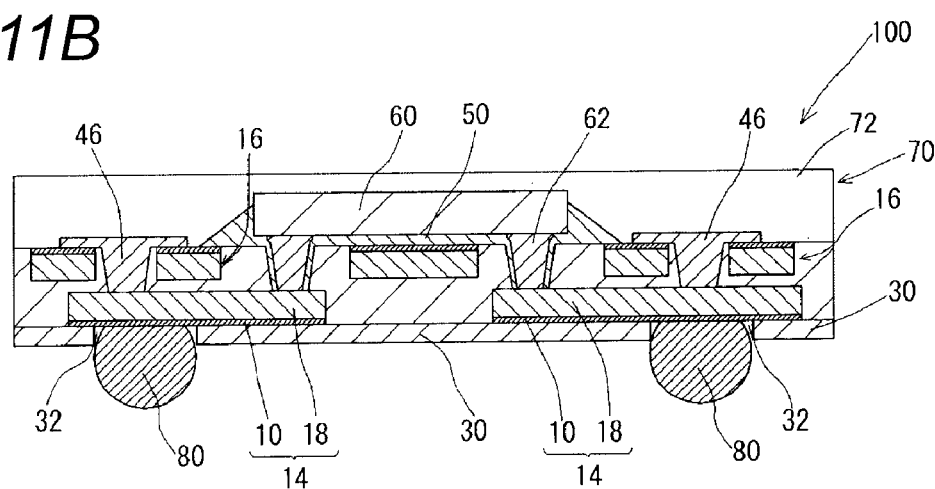

Next, as illustrated in FIG. 11A, the second carrier tape 40 is removed. The second carrier tape 40 also can be peeled off manually and easily. As described above, an acrylic adhesive agent is used as the adhesive agent for the second carrier tape 40. Thus, the second carrier tape 40 can easily be peeled off. However, sometimes, the adhesive agent is changed in nature by being heated when the laminated body is resin-sealed. Thus, the adhesive or the changed adhesive may remain on portions of the first wiring pattern layer 14, which are exposed from the openings 32 in the solder resist 30. In such a case, each exposed surface (i.e., each connection pad surface) of the first wiring pattern layer 14 can be cleaned by plasma processing. Argon plasma etching or oxygen plasma etching can be used as the plasma processing.

After cleaning the portions of the first wiring pattern layer 14, which are exposed from the opening 32, external connection terminals 80 such as solder bumps are provided on the exposed portions of the first wiring pattern layer 14. Thus, a semiconductor device 100 illustrated in FIG. 11B can be obtained. The semiconductor device 100 is divided by, e.g., a dicer into individual pieces, as occasion demands.

Fourth Embodiment

Figure 12A:
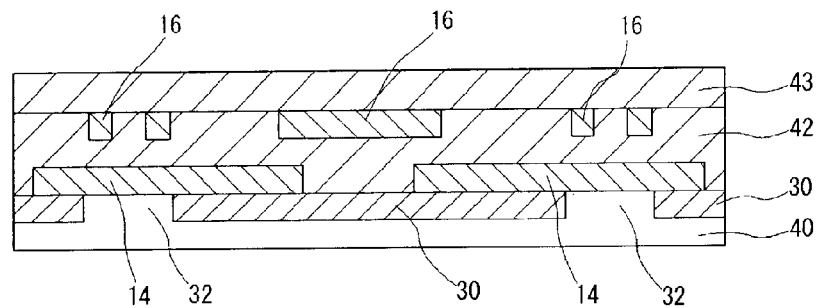
FIGS. 12A to 12C are cross-sectional views illustrating manufacturing steps of a semiconductor device according to a fourth embodiment of the invention.
Figure 12B:
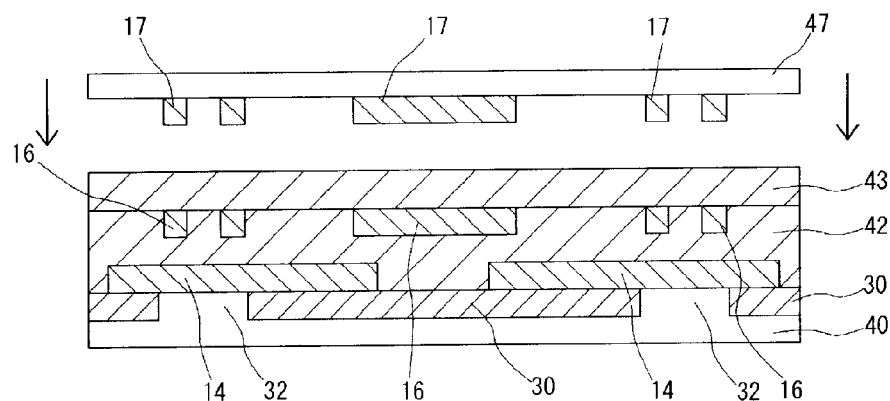
Figure 12C:
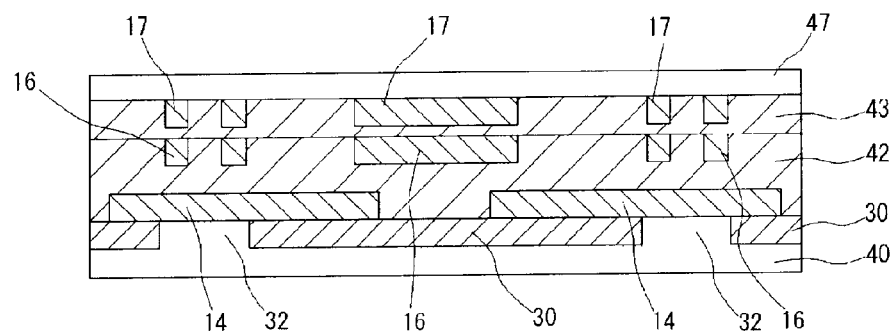

In the above-described exemplary embodiments, there has been described the case that two wiring pattern layers are provided between the solder resist 30 and the semiconductor element 60. However, the number of the wiring pattern layers constituting the wiring layer is not limited to 2. The wiring layer provided between the solder resist 30 and the semiconductor element 60 may include three or more wiring pattern layers. In the fourth embodiment, a semiconductor device 100 is constituted by a wiring layer including three wiring pattern layers. Although the number of the wiring pattern layers according to the first embodiment is set to 3 in the fourth embodiment, it is apparent that this configuration can be applied to the second embodiment and the third embodiment. FIGS. 12A to 12C are cross-sectional views illustrating manufacturing steps of the wiring layer of the semiconductor device according to the fourth embodiment.

First, according to a process similar to that described in the first embodiment, a process until the formation of the second wiring pattern layers 16 is performed (see FIGS. 1A to 3B). Also, an element referred to as the insulating resin 42 in the first embodiment is referred to as a first insulating resin 42 in the fourth embodiment. Next, a second insulating resin 43 is formed on the second wiring pattern layer 16 and the first insulating resin 42. A material which is the same as the first insulating resin 42 can be used as the second insulating resin 43. As illustrated in FIG. 12A, the second insulating resin 43 is formed such that the thickness thereof is less than that of the first insulating resin 42. However, in a case where the thickness of the first insulating resin 42 is sufficiently thin, the thickness of the second insulating resin 43 can be set equal to that of the first insulating resin 42 (i.e., the insulating resin material can be communized therebetween). The thickness of the second insulating resin 43 is not limited to a specific value, as long as the second wiring pattern layer 16 can surely be insulated from the third wiring pattern layer 17 formed in the subsequent step. Incidentally, the second insulating resin 43 is maintained in an uncured state.

Next, a fourth carrier tape 47, on which the third wiring pattern layer 17 is formed, is prepared. It is advantageous to apply the method of forming the second wiring pattern layer 16 on the third carrier tape 41 to a method of forming the third wiring pattern layer 17 on the forth carrier tape 47.

Figure 13A:
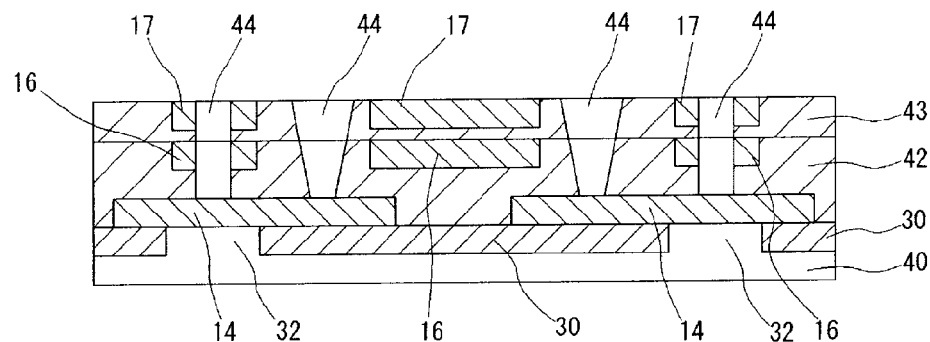
FIGS. 13A to 13C are cross-sectional views illustrating manufacturing steps of the semiconductor device according to the fourth embodiment.

As illustrated in FIG. 12B, the third wiring pattern layer 17 is embedded in the uncured second insulating resin 43 by pressing the fourth carrier tape 47 against the second insulating resin 43 while the third wiring pattern layer 17 faces to the uncured second insulating resin 43. Similarly to the second wiring pattern layer 16, the top surface of the third wiring pattern layer 17 is flush with the top surface of the second insulating resin 43. FIG. 12C illustrates a state in which the third wiring pattern layer 17 is embedded in the second insulating resin 43. After the third wiring pattern layer 17 is embedded in the second insulating resin 43, the fourth carrier tape 47 is peeled off and removed Next, as illustrated in FIG. 13A, via-holes 44 are formed to penetrate the second insulating resin 43 and the first insulating resin 42 using the laser light irradiating apparatus. Each of the second wiring pattern layer 16 and the third wiring pattern layer 17 is electrically connected to at least one of the first wiring pattern layer 14, the second wiring pattern layer 16, and the third wiring pattern layer 17 at a position at which an associated one of the via-holes 44 is formed. Preferably, the via-hole 44 formed at a position, where all of the first wiring pattern layer 14, the second wiring pattern layer 16 and the third wiring pattern layer 17 are electrically connected to one another, is formed into a shape in which the diameter of an opening surface (a surface of the third wiring pattern layer 17 or a surface of the second insulating resin 43) is substantially equal to that of the bottom surface (i.e., the top surface of the first wiring pattern layer 14).

Figure 13B:
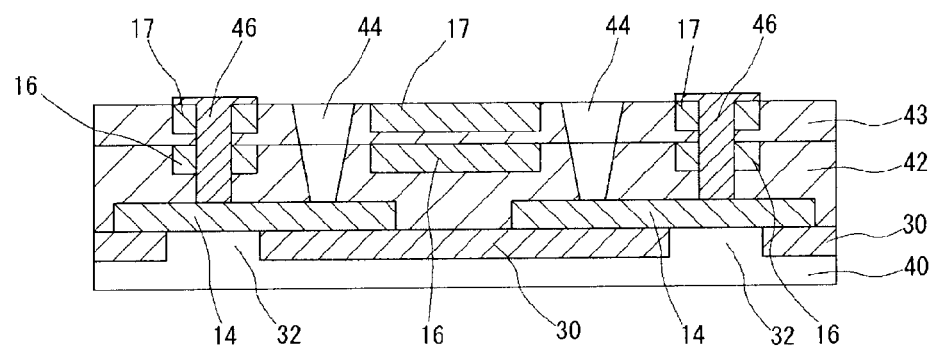

Electrical conductive materials 46 are filled in the via-holes 44, as illustrated in FIG. 13A. Then, the first wiring pattern layer 14, the second wiring pattern layer 16, and the third wiring pattern layer 17 are electrically connected to one another (see FIG. 13B). Also, the method described in the above embodiments can be used as a method of filling the conductive material 46 in the via-hole 44.

Figure 13C:
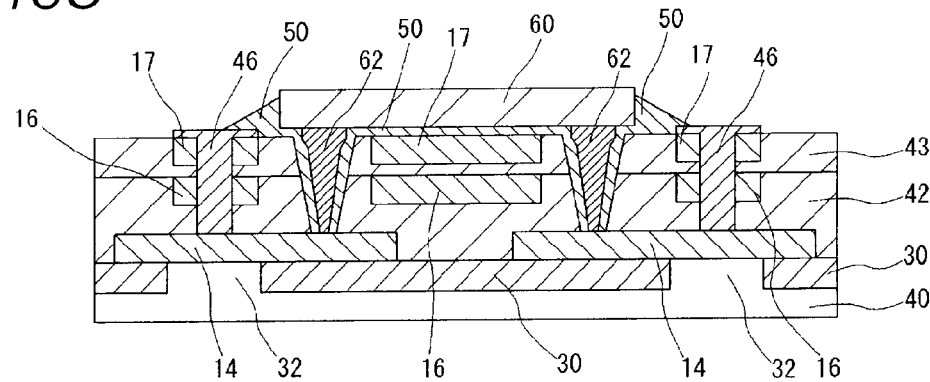

Next, after the underfill resin 50 is provided on the top surface of the third wiring pattern layer 17, a semiconductor element 60 having electrodes 62 (a bump) thereon is mounted on the second insulting resin 43 such that the electrodes 62 are disposed in the via-holes 44 in which no conductive material 46 is filled (however, the underfill resin 50 is partially filled). Thus, the semiconductor element 60 is electrically connected to a portion of the first wiring pattern layer 14, which is exposed from the via-holes, through the electrodes 62 (see FIG. 13C). Preferably, the first wiring pattern layer 14 is electrically connected to the electrodes 62 of the semiconductor element 60 by simultaneously applying ultrasonic vibrations to the semiconductor element 60, similarly to the above embodiments.

Figure 14A:
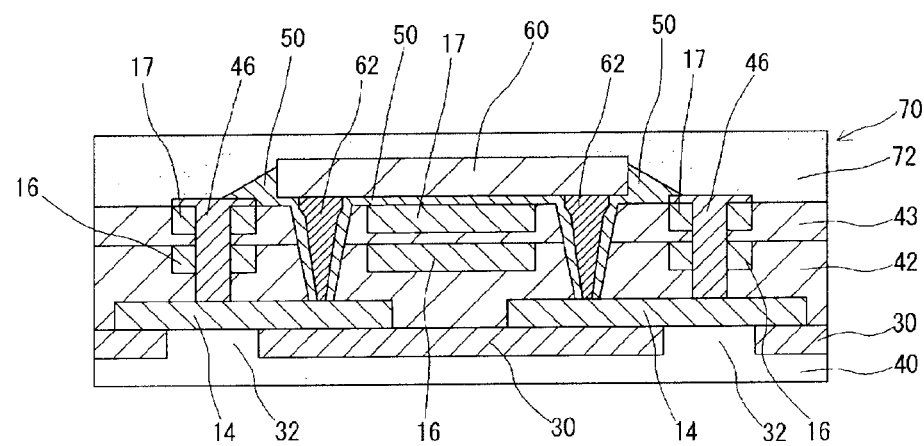
FIGS. 14A and 14B are cross-sectional views illustrating manufacturing steps of the semiconductor device according to the fourth embodiment.

After the underfill resin 50 is cured, the semiconductor element 60 is resin-sealed with a sealing resin 72 to cover the surface of the semiconductor device, on which the semiconductor element 60 is mounted. According to the present embodiment, as illustrated in FIG. 14A, the third wiring pattern layer 17, the conductive layer 46, and the second insulating resin 43 are resin-sealed, in addition to the semiconductor element 60. Preferably, a transfer molding method is used when the resin-sealing is performed thereon. The underfill resin 50 can be thermally cured using heat generated in this resin sealing step.

Next, the second carrier tape 40 is removed to thereby expose the bottom surface of the first wiring pattern layer 14 from the openings 32 formed in the solder resist 30. In a case where the adhesive agent of the second carrier tape 40 may be changed in nature by the transfer molding method, the lower surface (the connection pad surface) of the first wiring pattern layer 14, which is exposed from the opening 32, can be cleaned by plasma processing. Argon plasma etching or oxygen plasma etching can be used as the plasma processing, similarly to the above embodiments.

Figure 14B:
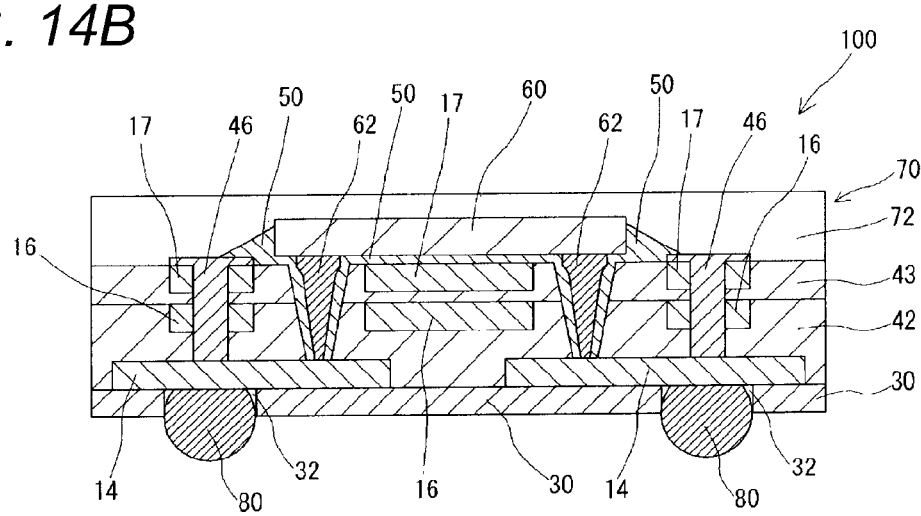
Figure 15:
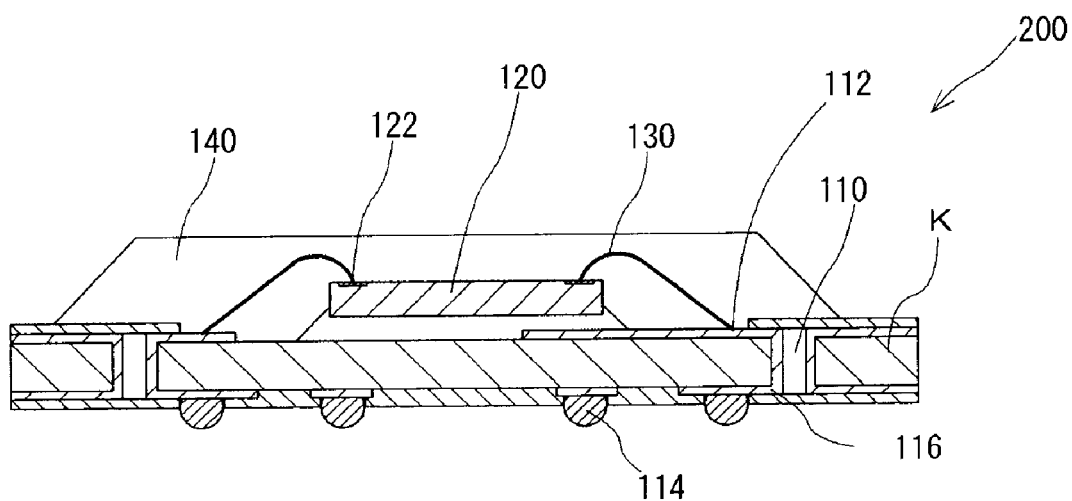
FIG. 15 is a cross-sectional view illustrating the related-art semiconductor device.
Figure 16:
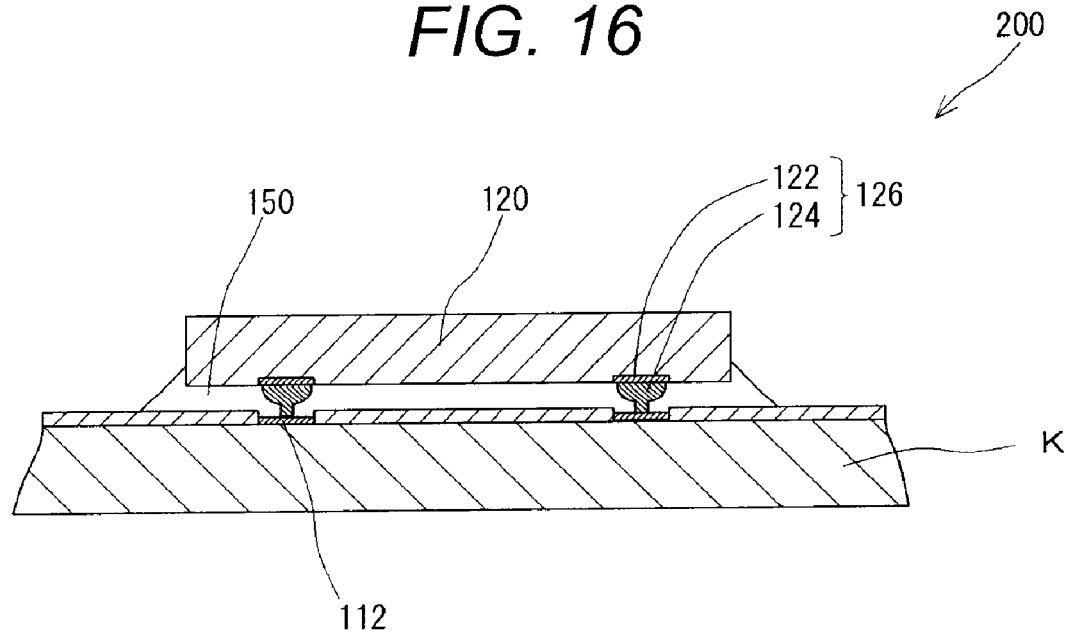
FIG. 16 is a cross-sectional view illustrating the related-art semiconductor device.

External connection terminals 80 each formed of a solder bump or the like are provided on the lower surfaces (i.e., the connection pad surfaces) of the first wiring pattern layer 14, each of which is exposed from the openings 32 and are cleaned by the plasma processing. Thus, a semiconductor device 100 illustrated in FIG. 14B can be obtained.

In the exemplary embodiments of the invention, the semiconductor device 100 and the manufacturing method thereof have been described in detail. However, it is apparent that exemplary embodiments are not limited to the above embodiments. For example, in the third embodiment, the first wiring pattern 14 and the second wiring pattern 16 in the first embodiment are formed by the semi-additive method, instead of the subtractive method. However, it is apparent that the semi-additive method can be used as the method of forming the wiring patterns 14 according to the second and third embodiments, instead of the subtractive method.

Although the second embodiment is a modification of the first embodiment, the configuration of the second embodiment can be applied to the third embodiment and the fourth embodiment.

Although the copper foil 10 is used as the metal foil in the above embodiments, it is apparent that other types of metal foils can be used. Further, according to the forming methods of the first and second wiring pattern layers 14, 16, the thickness of about 12 µm to about 15 µm (in the case of using the subtractive method) and that of about 2 µm to about 3 µm (in the case of using the semi-additive method) are employed as the thickness dimension of the copper foil 10. However, it is apparent that the thickness of the metal foil can appropriately be adjusted.

It is apparent that the appropriate combination of all the above embodiments falls within the scope of the present invention.

While the present invention has been shown and described with reference to certain example embodiments, other implementations are within the scope of the claims. It will be understood by those skilled in the art that various changes in form and details may be made therein without departing from the spirit and scope of the invention as defined by the appended claims.

What is claimed is:

1. A semiconductor device, comprising:
a first insulating layer having an opening therethrough;
a first wiring pattern disposed on the first insulating layer;
an external connection terminal provided on a portion of the first wiring pattern which is exposed from the opening;
a second insulating layer which covers the first wiring pattern and which comprises a plurality of via holes therethrough;
a second wiring pattern disposed within the second insulating layer and electrically connected to the first wiring pattern via a conductive material filled in at least one of the via holes;
a semiconductor element having an electrode thereon and being mounted on the second insulating layer so as to be electrically connected to the first wiring pattern through the electrode, wherein the electrode is disposed in at least one of the via holes;
an underfill resin which is filled between the semiconductor element and the second insulating; and
a sealing resin portion which seals the semiconductor element.

2. A semiconductor device, comprising:
a first insulating layer having an opening therethrough;
a first wiring pattern disposed on the first insulating layer;
an external connection terminal provided on a portion of the first wiring pattern which is exposed from the opening;
a second insulating layer which covers the first wiring pattern and which comprises a via hole and a through hole, wherein the through hole is configured to penetrate the second insulting layer and the first insulating layer;
a second wiring pattern disposed within the second insulating layer and electrically connected to the first wiring pattern via a conductive material filled in the via hole;
a semiconductor element having an electrode thereon and being mounted on the second insulating layer, wherein the electrode is disposed in the through hole;
an underfill resin which is filled between the semiconductor element and the second insulating layer; and
a sealing resin portion which seals the semiconductor element.

3. The semiconductor device according to claim 1, wherein the conductive material is a conductive paste.

4. The semiconductor device according to claim 2, wherein the conductive material is a conductive paste.

* * * * *